United States Patent [19]

Ishida et al.

[11] Patent Number: 5,316,969
[45] Date of Patent: May 31, 1994

[54] METHOD OF SHALLOW JUNCTION FORMATION IN SEMICONDUCTOR DEVICES USING GAS IMMERSION LASER DOPING

[75] Inventors: Emi Ishida, Stanford, Calif.; Thomas W. Sigmon, Hillsboro, Oreg.; William T. Lynch, Apex, N.C.

[73] Assignee: Board of Trustees of the Leland Stanford Junior University, Stanford, Calif.

[21] Appl. No.: 993,788

[22] Filed: Dec. 21, 1992

[51] Int. Cl.$^5$ .................................. H01L 21/223
[52] U.S. Cl. ........................... 437/168; 437/942; 437/950; 148/DIG. 129
[58] Field of Search ............ 437/160, 165, 166, 168, 437/169, 907, 908, 934, 942, 943, 950; 148/DIG. 3, DIG. 4, DIG. 46, DIG. 71, DIG. 129, DIG. 144, DIG. 147, DIG. 134

[56] References Cited

U.S. PATENT DOCUMENTS

| | | | |
|---|---|---|---|
| 4,151,008 | 4/1979 | Kirkpatrick | 437/942 |
| 4,558,507 | 12/1985 | Okabayashi et al. | 437/160 |
| 4,661,177 | 4/1987 | Powell | 437/DIG. 4 |
| 4,669,176 | 6/1987 | Kato | 437/247 |
| 4,914,500 | 4/1990 | Liu et al. | 437/160 |
| 5,114,876 | 5/1992 | Weiner | 437/174 |

Primary Examiner—Brian E. Hearn
Assistant Examiner—C. Chaudhari
Attorney, Agent, or Firm—Townsend and Townsend Khourie and Crew

[57] ABSTRACT

Shallow regions are formed in a semiconductor body by irradiating the surface region with a pulsed laser beam in an atmosphere including the dopant. The pulsed laser beam has sufficient intensity to drive in dopant atoms from the atmosphere but insufficient intensity to melt the semiconductor material. A silicide layer can be placed over the surface of the semiconductor material prior to irradiation with the dopant being driven from the atmosphere through the silicide into the surface region of the semiconductor body. Alternatively, the silicide layer can include dopant atoms prior to irradiating the surface region.

19 Claims, 7 Drawing Sheets

METHOD OF SHALLOW JUNCTION FORMATION IN SEMICONDUCTOR DEVICES USING GAS IMMERSION LASER DOPING

BACKGROUND OF THE INVENTION

This invention relates generally to semiconductor device fabrication, and more particularly the invention relates to the formation of shallow junctions in a semiconductor device through the selective introduction of dopants.

Semiconductor devices and integrated circuits are fabricated through the selective introduction of dopant atoms into a semiconductor substrate. Conventionally, photoresist masking and chemical etching techniques are utilized to define diffusion windows for the dopant atom diffusion or ion implantation into the wafer.

With the reduction of dimensions of semiconductor devices and increased density of integrated circuits, shallower junctions are needed in the device structures. One method of obtaining shallow junctions is to outdiffuse dopants from a doped silicide layer into the underlying substrate using rapid thermal lamp annealing. The use of silicides minimizes contact and series resistances and prevents damage to the underlying silicon. Shorting problems which are encountered in the silicidation of preformed shallow junctions are prevented since the dopant profile in the silicon substrate follows the contour of the silicide/silicon interface.

Rapid thermal lamp annealing typically has a relatively long heat cycle (e.g., seconds) which limits the amount of dopant in shallow junction devices. Further, the entire wafer is heated, which can lead to warpage. Pulsed laser techniques have been introduced to overcome these limitations. In gas immersion laser doping (GILD) a suitably masked wafer of a semiconductor such as silicon is placed in a gas cell and immersed in a desired dopant gas such as $BF_3$, $ASF_5$, and $PF_5$/ A pulsed, high-intensity laser is then used to heat the masked wafer with dopant atoms being driven into a shallow silicon surface region during a melt/regrowth of the exposed silicon surface.

The present invention modifies the gas immersion laser doping process to provide shallower junctions and better process control and less dopant per pulse along with less disruption of existing doped regions.

SUMMARY OF THE INVENTION

In accordance with the present invention, a semiconductor wafer is immersed in a dopant gas and heated by a pulsed laser so that the wafer does not melt but dopant atoms are adsorbed on the surface prior to laser irradiation and diffused into the surface during irradiation. Since only a surface region is heated, selected doping of device areas is achieved. The pulsed laser has a short rise time during which dopants can desorb from the surface and allows dopants to be replenished onto the surface while the laser is off. The non-melt doping can be followed by a standard GILD process with melting to form shallow, square junctions.

Alternatively, the surface of the wafer can be covered by a silicide layer, and the dopant is diffused through the silicide into the surface region of the wafer. Since dopant diffusion coefficients in silicides are very large, melting of the silicide is not required to incorporate the dopant or to drive dopant into the film/substrate interface.

In accordance with another embodiment dopant can be concentrated in the silicide layer, and the laser outdiffuses the dopant atoms into the semiconductor surface regions.

The invention and objects and features thereof will be more readily apparent from the following detailed description and appended claims when taken with the drawings.

DESCRIPTION OF ILLUSTRATIVE EMBODIMENTS

Figure 1:
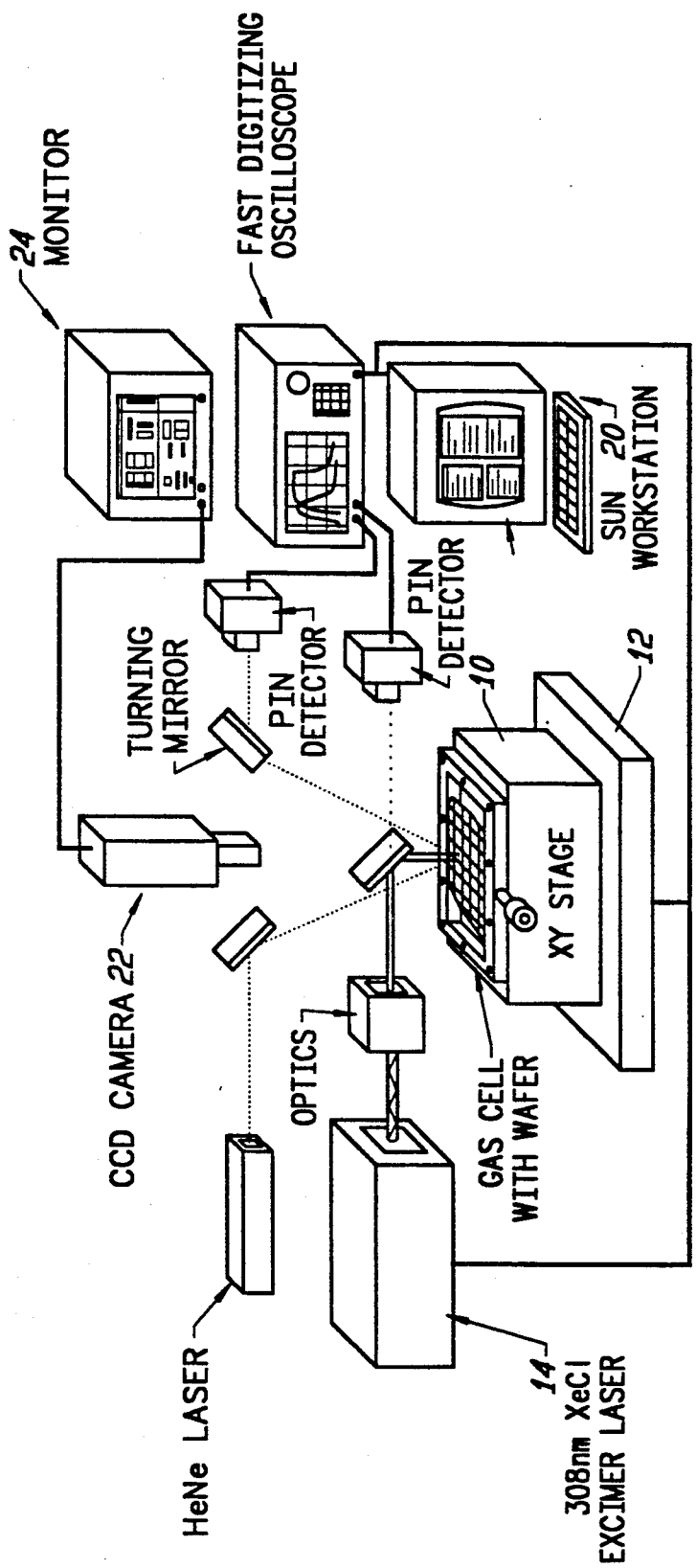
FIG. 1 is a schematic of a gas immersion laser doping apparatus.

Referring now to the drawings, FIG. 1 is a schematic of gas immersion laser doping apparatus which employs the present invention. A gas cell 10 containing a semiconductor wafer immersed in a dopant gas is mounted on an XY table 12 with the wafer irradiated by a laser beam from a 308 nm XECL excimer laser 14 which passes through optics 18 thence through a window in the gas cell for irradiation of the wafer. The laser 14 and XY table 12 are controlled during processing by a computer 20. A CCD camera 22 and monitor 24 continuously view the wafer during processing.

An HeNe laser 26 and oscilloscope 28 are used to monitor the non-melt condition as the wafer is doped.

Rather than using the XY table, the gas cell can be stationary while the laser is moved along X and Y coordinates.

In practicing the invention with the apparatus of FIG. 1, the gas cell is filled with the desired dopant gas such as $BF_3$, $ASF_5$, or $PF_5$. The gas pressure can be on the order of 50 Torr with the gas composition being up to 100% of the dopant gas. The dose of dopant depends on dopant gas concentration and pressure along with pulse intensity. Repetition rate can also affect the dose.

In practicing the invention the wafer is first cleaned between pre-dep and drive-in steps using standard organic, metal cleaning procedures and a 50:1 HF dip, for example. A concentrated vapor HF etch is used immediately prior to loading a wafer into the gas chamber. The wafer is suitably masked with a laser reflecting material or heat shield such as aluminum, polycrystalline silicon, oxides of silicon, and other metals so that only selected regions on the surface of the wafer are irradiated.

The technique can be applied in forming shallow junctions by outdiffusion from silicide films as has been demonstrated on tungsten silicide films using $BF_3$ gas ambient as a source for boron doping and $PF_5$ gas ambient as a source for n-type phosphorus doping. Again, for initial experiments gas pressure and composition were 50 Torr and 100% $BF_3$, typical of those used in the standard GILD process. Laser energy fluences were 600 mi/cm$^{-2}$ and 700 mJ/cm$^{-2}$. 1–500 pulses have been repeated at a 9 Hz rate. Using 600 mJ/cm$^{-2}$, approximately 1 e13 boron atoms cm$^{-2}$ were incorporated in a first heating pulse. Interface concentration of 2 e20 boron atoms cm$^{-3}$ was achieved using 100 pulses at 600 mj/cm$^{-2}$ energy fluence. For these conditions, 100 pulses at 600 mJ/cm$^{-2}$, no melting of the silicide film was detected using an HeNe laser reflectivity probe.

The method can be applied to other silicides such as cobalt silicide and to other dopants such as arsenic. A variation on the technique is to use the laser to incorporate a high concentration of dopant in the silicide layer only, and use outdiffusing techniques such as rapid thermal lamp annealing to drive the dopants into the silicon. The laser can also be used to outdiffuse dopants which were incorporated in the silicide by other means such as ion implantation.

EXAMPLE 1

Figure 2:
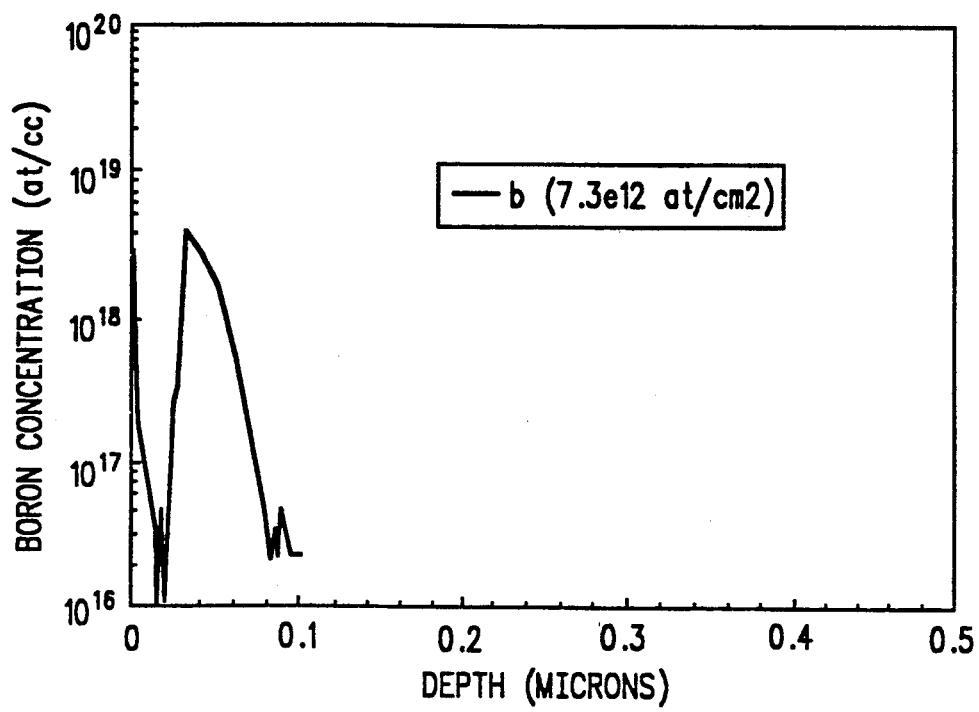
FIG. 2 is a graph illustrating SIMS results from a non-melt sample in accordance with one embodiment of the invention.

FIG. 2 presents SIMS results from a non-melt boron doped sample which shows a 600Å junction depth and a ~7.3e12 cm$^{-2}$ dose fabricated using 500 non-melt pulses at 5 Hz repetition rate.

Figure 3:
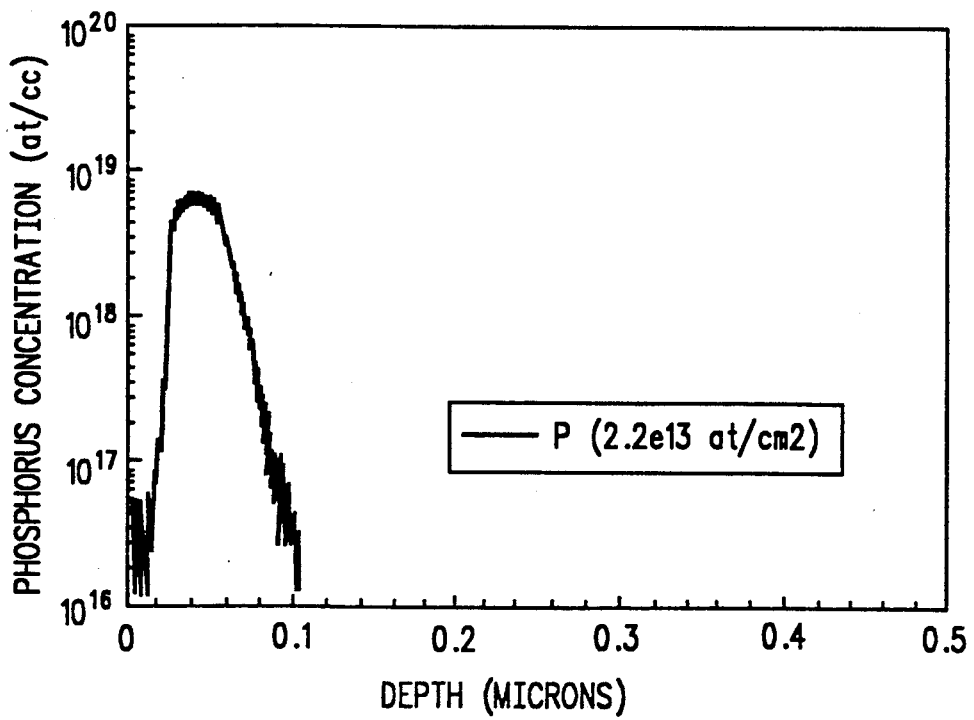
FIG. 3 is a graph illustrating SIMS results from another non-melt sample.
Figure 4:
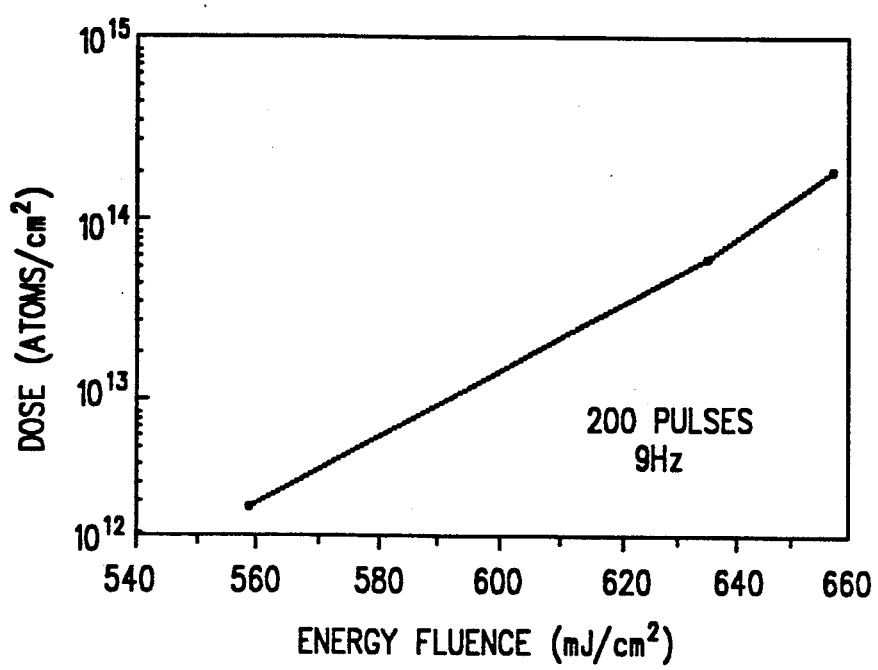
FIGS. 4 and 5 illustrate non-melt dose as a function of laser energy and as a function of number of pulses, respectively.
Figure 5:
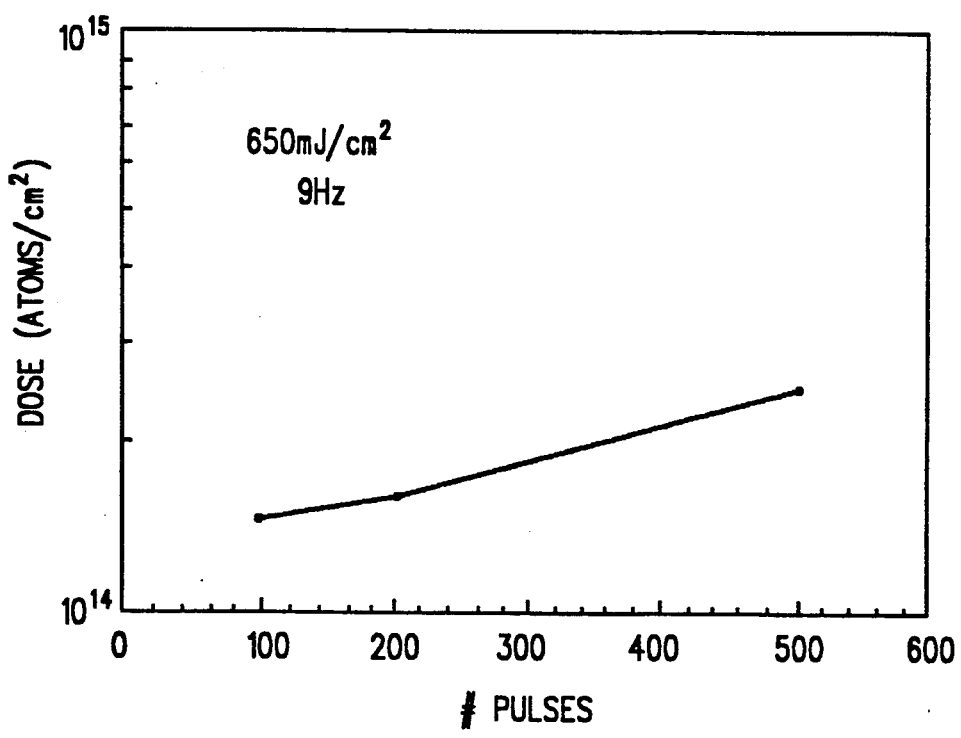

FIG. 3 presents the SIMS results for a sample which received 20 non-melt pre-dep pulses and 15 drive-in pulses at 17.5 ns melt duration. Pre-dep was conducted in a 53.2 Torr $PF_5$ gaseous ambient, and drive-in was conducted in 50 Torr $N_2$. The wafer was cleaned using a 30second HF vapor etch between predep and drive-in. The non-melt dose as a function of laser energy and as a function of number of pulses is shown in FIGS. 4 and 5, respectively. These figures show that good control over dose can be obtained by varying either the laser energy or by varying the number of pulses. Extremely shallow ($-60$ nm), lightly doped ($-10^{18}$ cm$^{-3}$) n-source and -drain layers have been achieved and as required for a hot-carrier suppressed MOSFET, such as shown in Tasch, U.S. Pat. No. 5,012,306 for Hot-Carrier Suppressed SubMjcron MOSFET Device. The layers were fabricated using a non-melt pre-dep in a $PF_5$ gaseous ambient, followed by a melt drive-in (20–35 ns melt duration) in a nitrogen ambient.

EXAMPLE 2

Doping of silicide films from the gas phase can be achieved using modifications to the standard GILD process similar to those made for non-melt doping, i.e., low laser energies and many pulses per die. A 2500Å thick $WSi_2$ film was deposited on an n-type wafer in a GENUS LPCVD system and subsequently annealed at 1000° C. for 30 minutes. Following a cleaning procedure (4:1 $H_2SO_4$:$H_2O_2$/rinse, 5:1:1 HCl:$H_2O_2$:$H_2O$/-rinse, spin dry), the wafer was immersed in a 55 Torr $BF_3$ dopant gas ambient and then subjected to a matrix of laser conditions. The number of pulses, pulse repetition rate, and laser energy fluence were varied. Sample H6 received 100 pulses, at 9 Hz rep rate, and laser energy fluence 600 mJ/cm$^2$. GILD doping of $WSi_2$ films and the underlying silicon substrate was monitored using SIMS.

Figure 6:
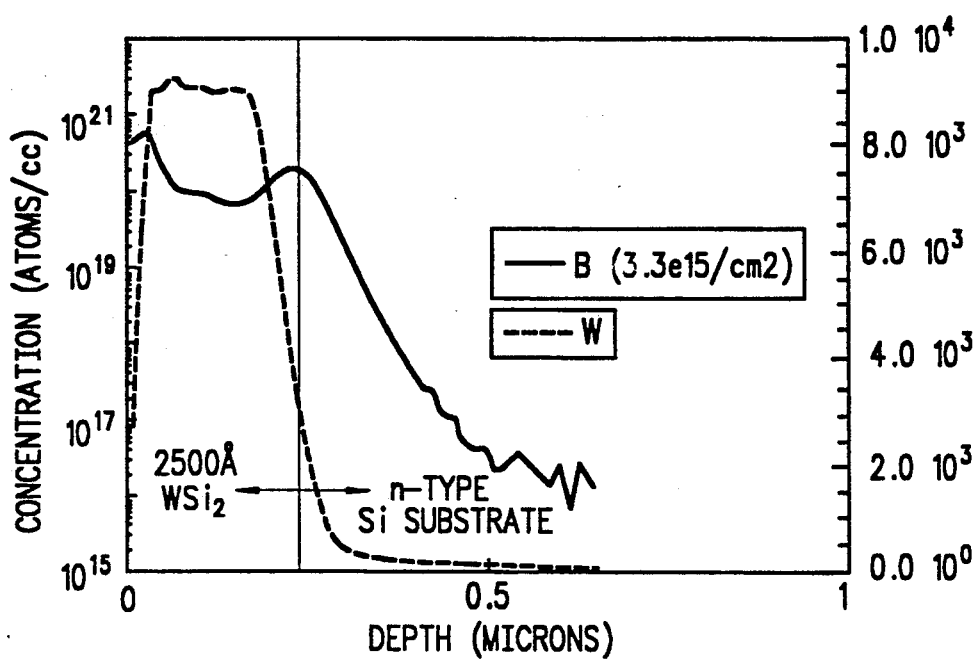
FIG. 6 and 7 illustrates SIMS results for a sample having a silicide film.
Figure 7:
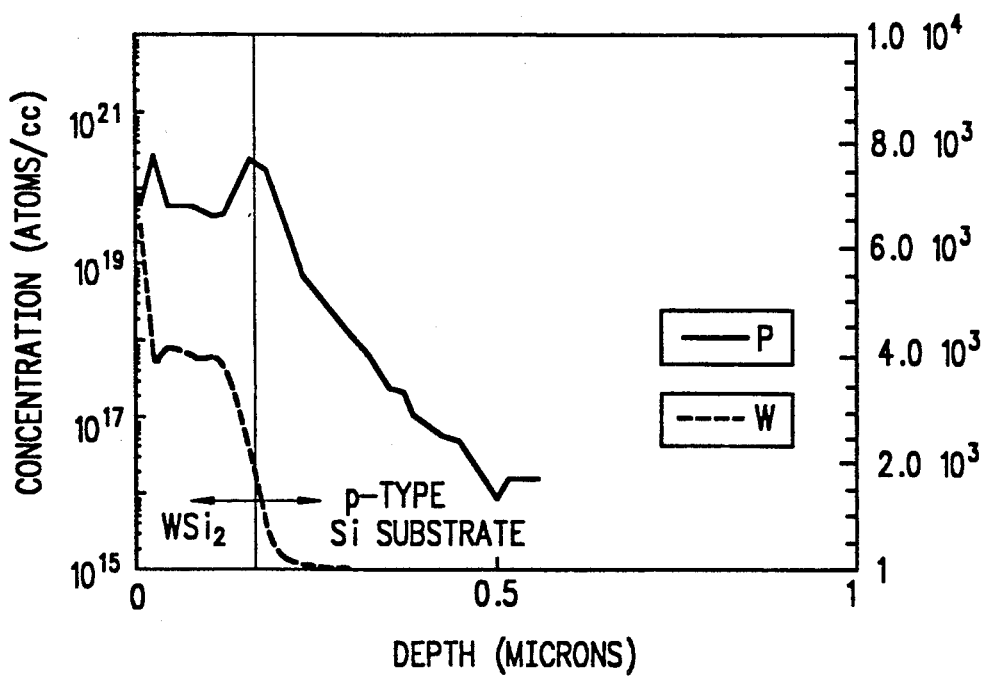

High interface concentrations ($C_{int} > 10$ Boron/cm$^3$) and shallow junctions (xj$<$1500Å) were obtained when using GILD to dope the tungsten silicide films and the underlying silicon substrate. No melting was observed using a HeNe laser reflectivity probe. FIG. 6 gives the processed SIMS data for boron-doped sample. FIG. 7 shows processed SIMS data for a phosphorus doped sample which received 500 pulses at 1.2 j/cm$^2$ laser energy fluence.

Figure 9:
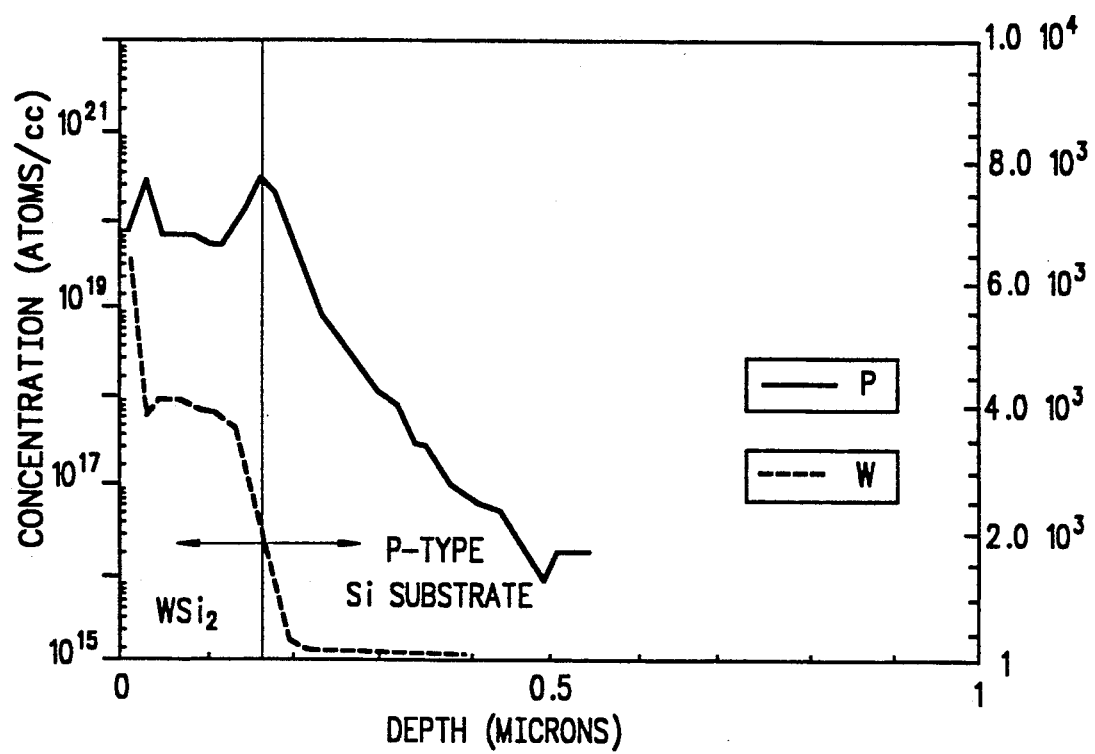
FIG. 9 illustrates SIMS results for other samples doped in accordance with the invention.

Results are presented in FIG. 9 for n-type doping of tungsten silicide films using $PF_5$ gaseous dopant source. The SIMS results show high interface concentration ($>10^{20}$ P/cm$^3$) and shallow junction ($\sim$1500Å). The roughening of the film/substrate interface which is indicated by the broad W and P tails is believed to be due to the Cs+ion bombardment during SIMS and not due to the laser process, since these tails are observed in the cesium bombardment spectra of non-laser processed samples as well. The interface roughness of these non-laser processed samples is close to that of the non-laser processed samples, which were analyzed using oxygen ion bombardment, since the silicide films were deposited in the same run. The samples analyzed using oxygen ion bombardment did not exhibit broad tiling, ana RBS analysis and TEM micrographs did not indicate rough interfaces.

Figure 8A:
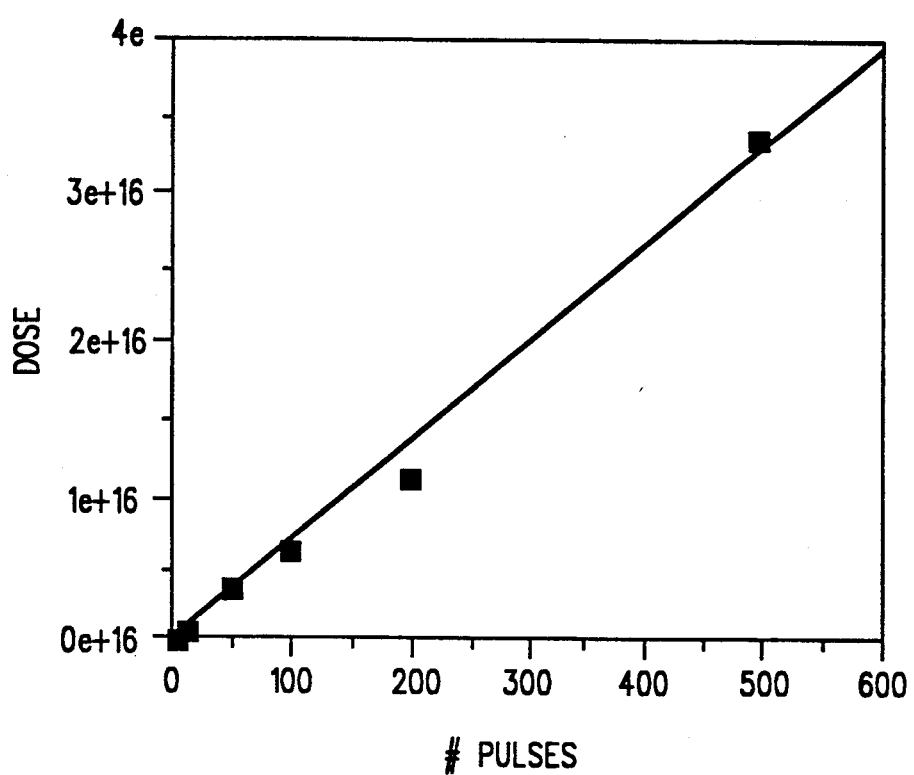
FIGS. 8A–8C illustrate dose versus number of pulses, junction depth versus number of pulses, and interface versus number of pulses for samples with silicide films.
Figure 8B:
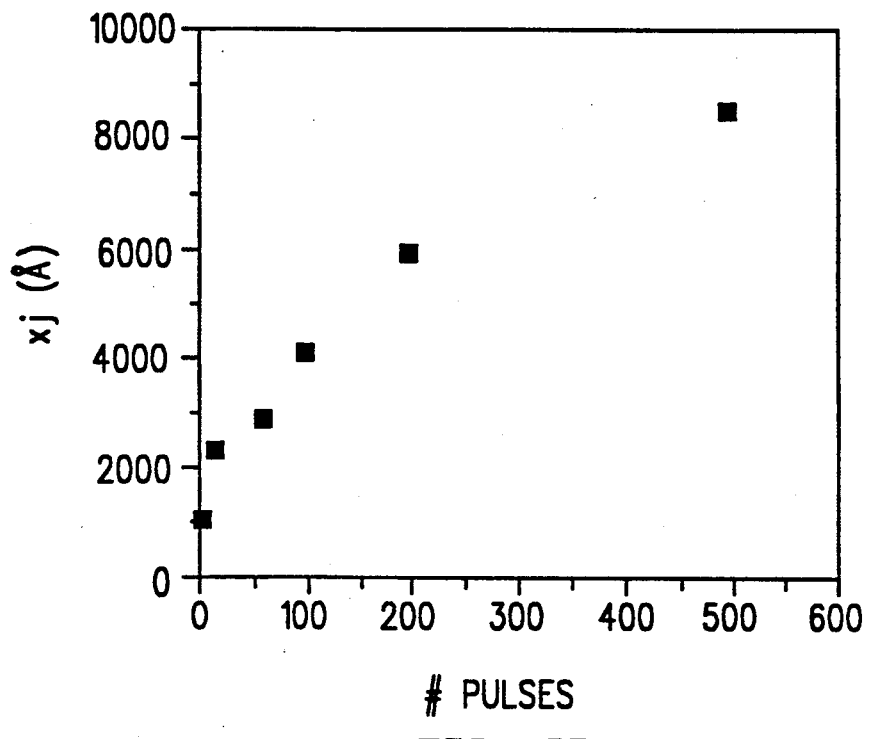
Figure 8C:
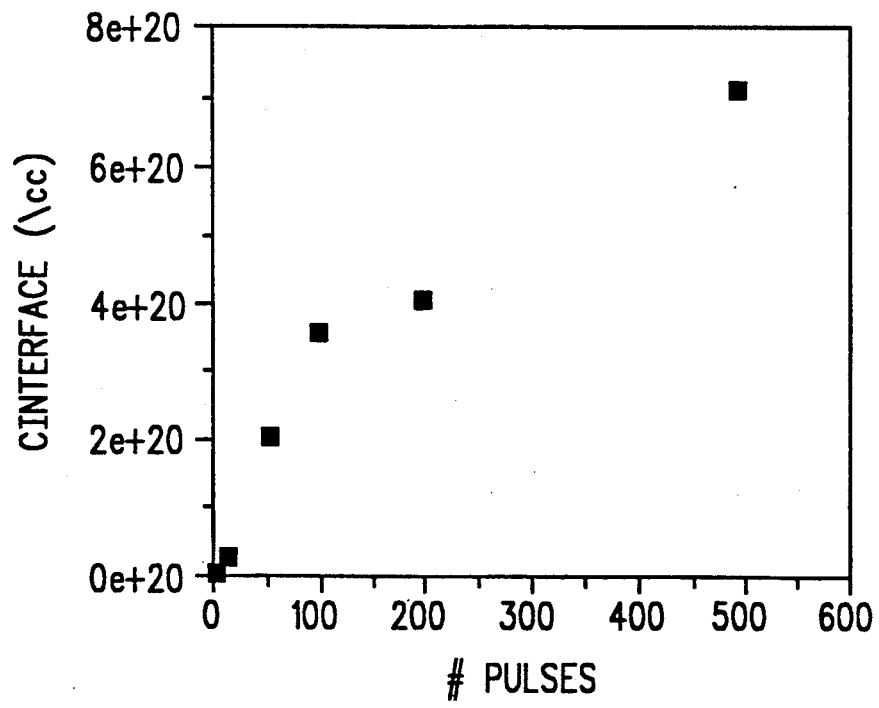

Control over dose is achieved by varying the number of laser pulses. This is illustrated in FIG. 8A which plots boron dose versus number of laser pulses. FIGS. 8B and 8C plot junction depth versus number of pulses and interface concentration versus number of pulses, respectively.

There has been described an improved method of fabricating shallow junction in semiconductor devices using gas immersion laser doping apparatus. While the invention has been described with references to illustrative embodiments, the description is illustrative of the invention and is not to be construed as limiting the invention. various modifications and applications may occur to those skilled in the art without departing from the true spirit and scope of the invention as defined by the appended claims.

What is claimed is:

1. A method of doping a surface region in a surface of a semiconductor body comprising the steps of
    (a) masking said surface with a reflective material with said surface region exposed,
    (b) immersing said semiconductor body in an atmosphere including a dopant, with said surface adsorbing dopant atoms, and
    (c) irradiating said surface with a pulsed radiation beam of sufficient intensity to drive into said surface region atoms of said dopant without melting said semiconductor body, said dopant atoms being replenished on said surface between laser pulses.

2. The method as defined by claim 1 wherein step (c) includes directing a pulsed laser beam onto said surface.

3. The method as defined by claim 2 and further including the step of applying a silicide layer on said surface prior to masking said surface, and wherein step (c) drives atoms of said dopant through said silicide layer into said surface region.

4. The method as defined by claim 3 wherein the semiconductor body comprises silicon and said silicide comprises tungsten silicide.

5. The method as defined by claim 3 wherein said silicide layer includes atoms of said dopant prior to irradiating said semiconductor body.

6. The method as defined by claim 2 wherein said masking material comprises aluminum.

7. The method as defined by claim 2 wherein said masking material comprises polycrystalline silicon.

8. The method as defined by claim 2 wherein said masking material comprises a high temperature material.

9. The method as defined by claim 2 wherein said pulsed laser beam is a patterned laser beam.

10. The method as defined by claim 1 wherein said semiconductor material comprises silicon.

11. The method as defined by claim 10 wherein said atmosphere includes a gas selected from the group consisting of $BF_3$, $ASF_3$, and $PF_5$.

12. The method as defined by claim 11 wherein said gas comprises substantially 100% of said atmosphere.

13. The method as defined by claim 12 wherein pressure of said atmosphere is approximately 50 Torr.

14. The method as defined by claim 1 and further including the step of irradiating and melting said surface region to form a surface region having a box-like shape and depth of less than 1 micron.

15. A method of doping a surface region in a surface of a semiconductor body comprising the steps of (a) forming a silicide layer on said surface of said semiconductor body, (b) immersing said semiconductor body and silicide layer in an atmosphere including a dopant, with said silicide layer adsorbing dopant atoms, and (c) irradiating said silicide layer with a pulsed radiation beam of sufficient energy to drive atoms into said silicide layer, said dopant atoms being replenished on said surface between laser pulses.

16. The method as defined by claim 15 and further including before irradiating said silicide layer the step of masking said silicide layer with a reflective material with said silicide layer over said surface region being exposed to said pulsed radiation beam.

17. The method as defined by claim 16 wherein said semiconductor body comprises silicon and said silicide comprises tungsten silicide.

18. The method as defined by claim 17 wherein said masking material comprises aluminum.

19. The method as defined by claim 17 wherein said masking material comprises polycrystalline silicon.

* * * * *